United States Patent [19]
Yoshida

[11] Patent Number: 5,812,002
[45] Date of Patent: Sep. 22, 1998

[54] LATCHING CIRCUIT CAPABLE OF RAPID OPERATION WITH LOW ELECTRIC POWER

[75] Inventor: Makoto Yoshida, Tokyo, Japan

[73] Assignee: NEC Corporation, Tokyo, Japan

[21] Appl. No.: 664,006

[22] Filed: Jun. 14, 1996

[30] Foreign Application Priority Data

Jun. 16, 1995 [JP] Japan .................................. 7-150059

[51] Int. Cl.⁶ .................................................. H03K 3/356
[52] U.S. Cl. ........................... 327/210; 327/218; 327/205
[58] Field of Search ..................... 327/211, 218, 327/408, 437, 202, 203, 205; 326/27, 58, 98

[56] References Cited

U.S. PATENT DOCUMENTS

| | | | |
|---|---|---|---|
| 3,737,673 | 6/1973 | Suzuki | 326/98 |
| 4,629,909 | 12/1986 | Cameron | 327/211 |
| 4,709,173 | 11/1987 | Nishimichi et al. | 327/408 |
| 4,877,978 | 10/1989 | Platt | 326/58 |
| 5,013,940 | 5/1991 | Ansel | 326/27 |

FOREIGN PATENT DOCUMENTS

| | | |
|---|---|---|
| 61-121516 | 6/1986 | Japan . |
| 0516230 | 12/1992 | United Kingdom . |
| 0567716 | 11/1993 | United Kingdom . |

*Primary Examiner*—Peter S. Wong
*Assistant Examiner*—Shawn Riley
*Attorney, Agent, or Firm*—Whitham, Curtis, Whitham & McGinn

[57] ABSTRACT

In a latching circuit including a first inverter having first input and output sides, a second inverter having second input and output sides, the first input side is connected to an input terminal, the second input side is connected to the first output side, the second output side is connected to the input terminal, and the second inverter further has first and second transistors having a primary conduction-type and are serially connected between first power supply terminal and the input terminal and including first and second gates having first and second gate lengths, respectively, third and fourth transistors having a secondary conduction-type reverse to the primary conduction-type and are serially connected between a second power supply terminal and the input terminal and including third and fourth gates having third and fourth gate lengths, respectively. The first gate length is greater than the second gate length while the third gate length is greater than the fourth gate length.

4 Claims, 6 Drawing Sheets

LATCHING CIRCUIT CAPABLE OF RAPID OPERATION WITH LOW ELECTRIC POWER

BACKGROUND OF THE INVENTION

This invention relates to a latching circuit which is incorporated in an electronic equipment.

Generally, a latching circuit comprises a plurality of inverters which are electrically connected to each other in a loop-like fashion. The latching circuit further comprises a transfer gate which is rendered ON/OFF by a clock signal for renewal and holding operations of a latched data. An example of such a latching circuit is disclosed in Japanese Unexamined Patent Publication No. 121516/1986.

As will later be described more in detail, the conventional latching circuit comprises two inverters electrically connected to each other in a loop-like fashion, and two transfer gates. An input signal supplied to a data input terminal is supplied to an input side of the inverter through the transfer gate. From an output side of the inverter, an inverse output signal is supplied to an output terminal. Besides, the output side of the inverter is electrically connected to an input side of the inverter. An output side of the inverter is electrically connected to an input side of the inverter through the transfer gate. Herein, the inverters are constructed from P-channel type and N-channel type MOS transistors serially connected between a power source and a ground. Further, the transfer gates are operated by a clock signal which is supplied from a clock input terminal. The transfer gate is supplied with the clock signal through an additional inverter while the transfer gate is directly supplied with the clock signal. Accordingly, the transfer gates are supplied with the clock signals, respectively, which have reverse phases to each other. As a result, a first transfer gate is rendered OFF when a second transfer gate is rendered ON. On the contrary, the first transfer gate is rendered ON when the second transfer gate is rendered OFF.

However, the clock signal CLK is supplied to the two transfer gates in the latching circuit. There is a problem that large electric power is required in the latching circuit.

In the interim, there is another conventional latching circuit which has a structure similar to that of the above-mentioned latching circuit except that one of the transfer gates is deleted. By deleting the transfer gate, the latched data as well as the input signal are supplied to the input side of the inverter when the transfer gate is rendered ON. Since it is necessary to deal with the input signal as a new data, the inverter is designed to have a sufficiently small driving performance. Namely, the inverter is designed to have a driving performance not more than one-fifth of that of a circuit (not shown) for driving the input terminal.

On the other hand, it is inevitable that the transistors in the inverter is designed to have great gate lengths in the latching circuit. Therefore, gate capacities of the transistors become great. As a result, it is caused to occur that load to the inverter becomes great and set up time for the inverter becomes long. Accordingly, it is not suitable that the latching circuit is subjected to a rapid operation.

SUMMARY OF THE INVENTION

It is therefore an object of this invention to provide a latching circuit capable of carrying out rapid operation with low electric power.

Other objects of this invention will become clear as the description proceeds.

According to this invention, there is provided a latching circuit comprising: a first inverter which has a first input side and a first output side, the first input side being electrically connected to an input terminal; a second inverter which has a second input side and a second output side, the second input side being electrically connected to the first output side, the second output side being electrically connected to the input terminal, the second inverter further having: first and second transistors which have a primary conduction-type and which are serially connected between a first power supply terminal and the input terminal, the first and the second transistors including first and second gates, respectively, the first and the second gates having first and second gate lengths, respectively; third and fourth transistors which have a secondary conduction-type reverse to the primary conduction-type and which are serially connected between a second power supply terminal and the input terminal, the third and the fourth transistors including third and fourth gates, respectively, the third and the fourth gates having third and fourth gate lengths, respectively; the first gate length being greater than the second gate length; and the third gate length being greater than the fourth gate length.

The first gate of the first transistor may be electrically connected to the second power supply terminal, the third gate of the third transistor being electrically connected to the first power supply terminal, the gates of the second and the fourth transistors being electrically connected to the output side of the first inverter.

The first inverter may further comprise fifth and sixth transistors which are serially connected between the first and the second power supply terminals and which includes fifth and sixth gates, respectively, the fifth and sixth gates having fifth and sixth gate lengths, respectively, the second, the fourth, the fifth and the sixth gate lengths being equal to each other.

The latching circuit may further comprise a driving circuit which is electrically connected to the input terminal through a transfer gate and which has a first driving performance, the second inverter having a second driving performance, wherein the first driving performance is larger than the second driving performance.

DESCRIPTION OF THE PREFERRED EMBODIMENTS

Figure 1:
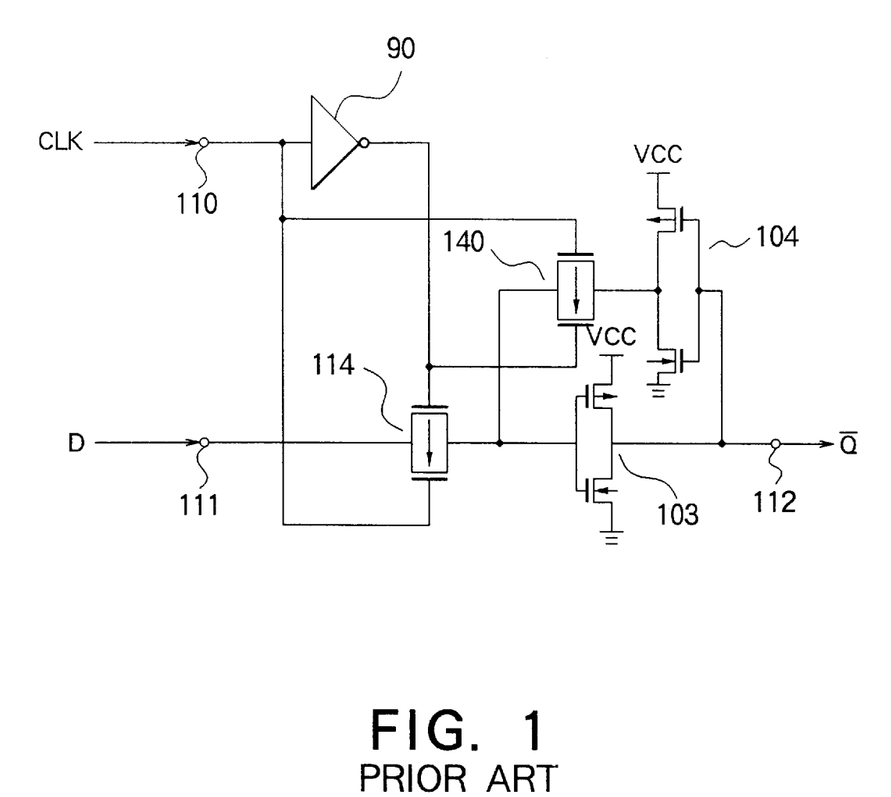
FIG. 1 is a view for describing a conventional latching circuit.
Figure 2:
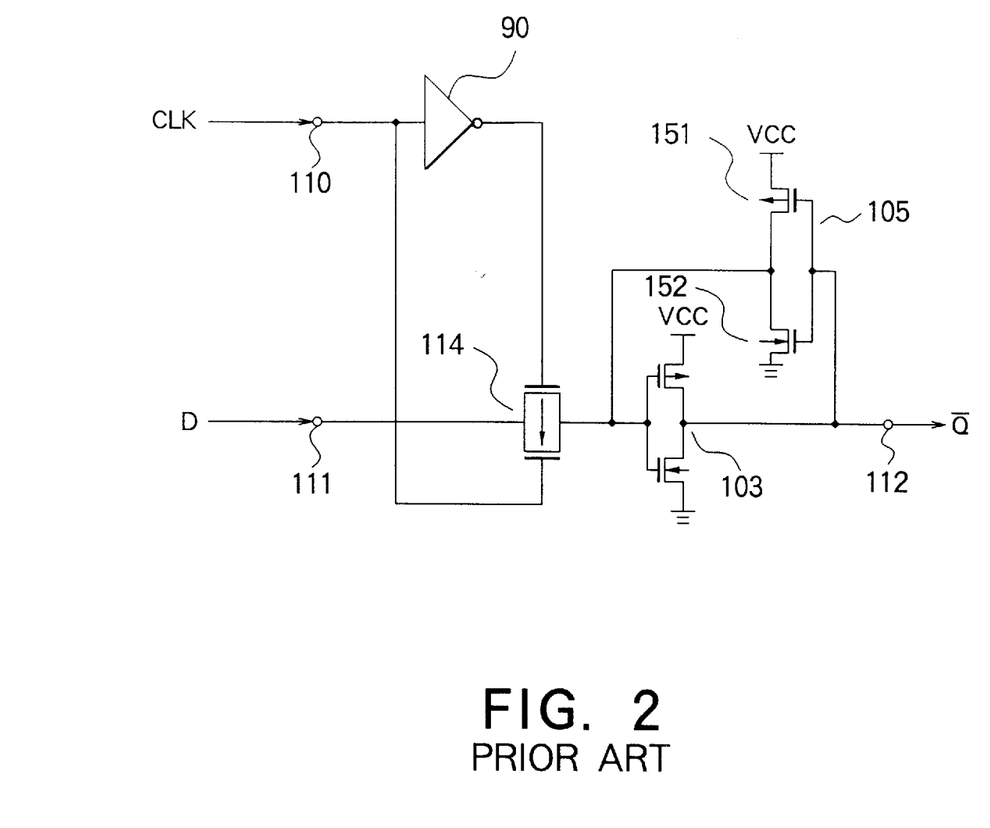
FIG. 2 is a view for describing another conventional latching circuit.

Referring now to FIGS. 1 and 2, conventional latching circuits will first be described for a better understanding of this invention.

In FIG. 1, a conventional latching circuit comprises two inverters 103 and 104 electrically connected to each other in a loop-like fashion, and two transfer gates 114 and 140. An input signal D supplied to a data input terminal 11 is supplied to an input side of the inverter 103 through the transfer gate 114. From an output side of the inverter 103, an inverse output signal Q is supplied to an output terminal 112. Besides, the output side of the inverter 103 is electrically connected to an input side of the inverter 104. An output side of the inverter 104 is electrically connected to an input side of the inverter 103 through the transfer gate 140. Herein, the inverters 103 and 104 are constructed from P-channel type and N-channel type MOS transistors serially connected between a power source and a ground.

Further, the transfer gates 114 and 140 are operated by a clock signal CLK which is supplied from a clock input terminal 110. A shown in FIG. 1, the transfer gate 114 is supplied with the clock signal CLK through an additional inverter 90 while the transfer gate 140 is directly supplied with the clock signal CLK. Accordingly, the transfer gates 114 and 140 are supplied with the clock signals CLK, respectively, which have reverse phases to each other. As a result, the transfer gate 140 is rendered OFF when the transfer gate 114 is rendered ON. On the contrary, the transfer gate 140 is rendered ON when the transfer gate 114 is rendered OFF.

Now, description is made about an operation of the conventional latching circuit illustrated in FIG. 1.

When the clock signal CLK is kept at a low level, the transfer gate 140 is rendered ON. A loop is thereby constructed by the inverters 103 and 104. On the other hand, the transfer gate 114 is rendered OFF, the input signal D supplied to the data input terminal 111 does not influence the loop. Accordingly, a data latched by the loop is held in spite of a level of the input signal D.

On the other hand, when the clock signal CLK is kept at a high level, the transfer gate 140 is rendered OFF. The transfer gate 114 is rendered ON while the loop constructed by the inverters 103 and 104 is broken. As a result, the input signal D supplied to the data input terminal 111 is supplied to the inverter 103. Therefore, the clock signal CLK is then turned into a low level, a new data is latched by the loop which is formed again.

In FIG. 2, illustrated is another conventional latching circuit. The latching circuit illustrated in FIG. 2 has a structure similar to that of the above-mentioned latching circuit illustrated in FIG. 1 except that the transfer gate 140 is deleted. By deleting the transfer gate 140, the latched data as well as the input signal D are supplied to the input side of the inverter 103 when the transfer gate 114 is rendered ON. Since it is necessary to deal with the input signal D as a new data, the inverter 105 is designed to have a sufficiently small driving performance. Namely, the inverter 105 is designed to have a driving performance not more than one-fifth of that of a circuit (not shown) for driving the input terminal 111.

In the interim, it is favorable to lengthen a gate length L of a transistor by which the inverter 105 is constructed in order to make the driving performance of the inverter 105 small. It is also favorable to make a channel width W of the transistor narrow. However, it is very difficult to make such a channel width of a transistor narrower, under the circumstances where an integration degree is increased and a fine manufacturing reaches the limit thereof. Consequently, it is almost impossible to make the driving performance not more than one-fifth of that of a general transistor only by making the channel width narrow. It is therefore a recent trend that the gate length L is lengthened to make the driving performance small. Under the situation, the transistors 151 and 152 in the inverter 105 is designed to have gate lengths L sufficiently greater than a gate length L of another transistors.

However, the clock signal CLK is supplied to the two transfer gates 114 and 140 in the latching circuit illustrated in FIG. 1. There is a problem that large electric power is required in the latching circuit.

On the other hand, it is inevitable that the transistors 151 and 152 in the inverter 105 is designed to have great gate lengths L in the latching circuit illustrated in FIG. 2. Therefore, gate capacities of the transistors 151 and 152 becomes great. As a result, it is caused to occur that load to the inverter 103 becomes great and set up time for the inverter 103 becomes long. Accordingly, it is not suitable that the latching circuit illustrated in FIG. 2 is subjected to a rapid operation.

Figure 3:
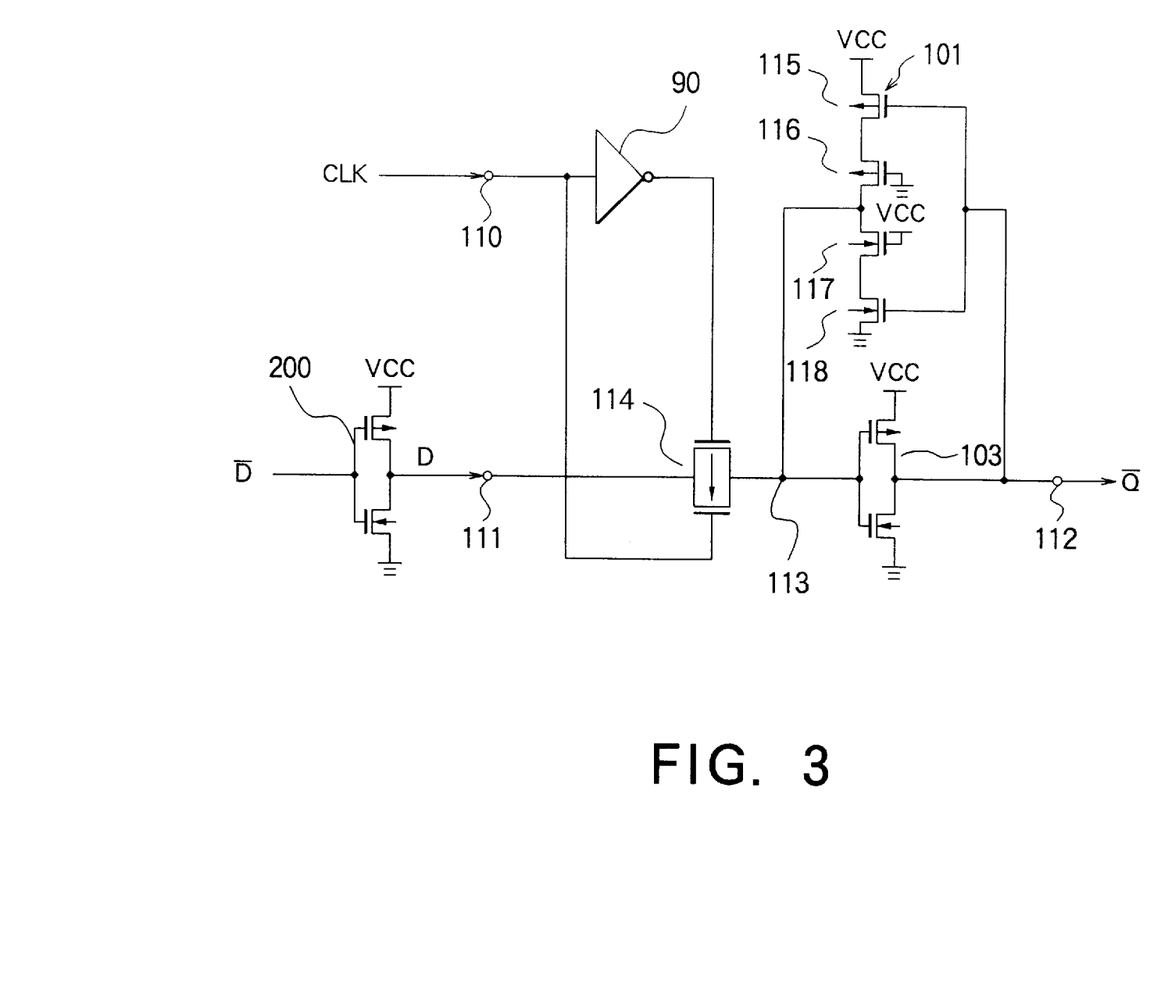
FIG. 3 is a view for describing a latching circuit according to a first embodiment of the present invention.
Figure 4:
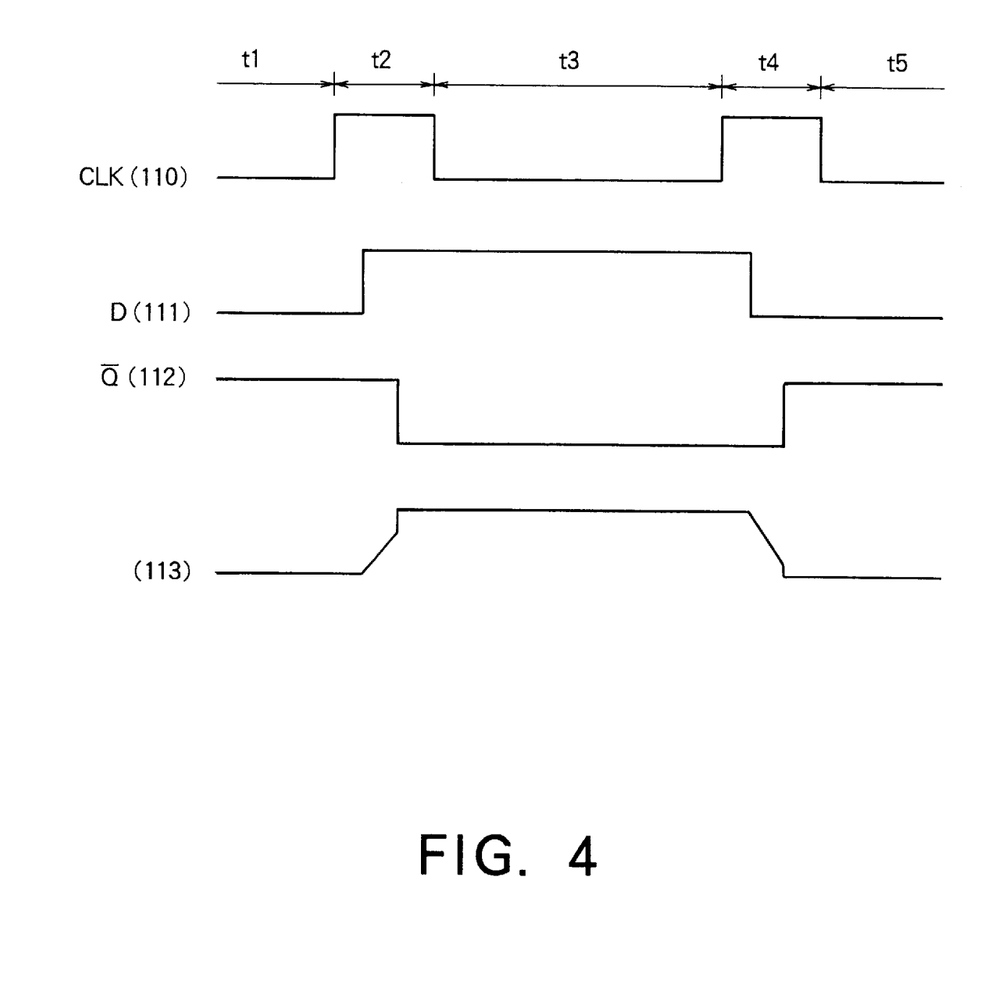
FIG. 4 is a timing chart for describing an operation of the latching circuit illustrated in FIG. 3.

Referring to FIGS. 3 and 4, description will proceed to a latching circuit according to a first embodiment of the present invention.

In FIG. 1, the latching circuit comprises two inverters 101 and 103 electrically connected to each other in a loop-like fashion, an output terminal 112 electrically connected to an output side of the inverter 103, and a data input terminal 111 electrically connected to an input side of the inverter 103 through a transfer gate 114. The data input terminal 111 is driven by a forward circuit 200. The transfer gate 114 has a structure similar to that of the conventional latching circuit illustrated in FIGS. 1 and 2. The transfer gate 114 is rendered ON/OFF in response to a clock signal CLK supplied to a clock input terminal 110. Herein, the inverter 103 is constructed from P-channel type and N-channel type MOS transistors serially connected between a power source and a ground. On the other hand, the inverter 101 comprises two P-channel type MOS transistors 115 and 116 serially connected between a power source and a ground, and two N-channel type MOS transistor 115 and the N-channel type MOS transistor 118 is electrically connected to the output side of the inverter 103. A gate of the P-channel type MOS transistor 116 is electrically connected to a ground while a gate of the N-channel type MOS transistor 117 is electrically connected to a power source. Accordingly, the P-channel type and the N-channel type MOS transistors 116 and 117 are always rendered ON.

Figure 6A:
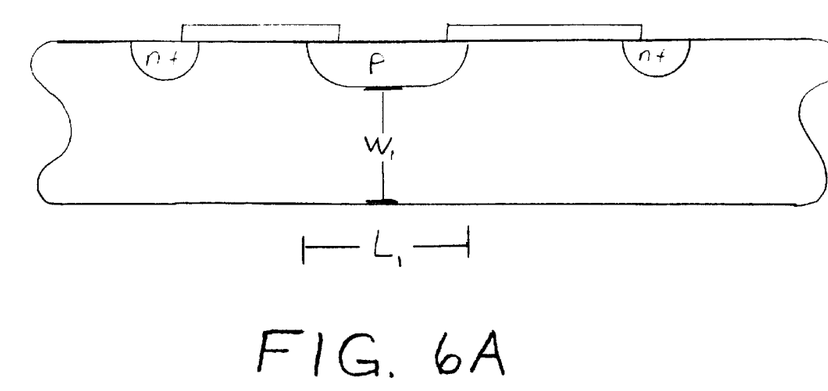
FIGS. 6A and 6B illustrate transistors having different gate lengths and channel widths.
Figure 6B:
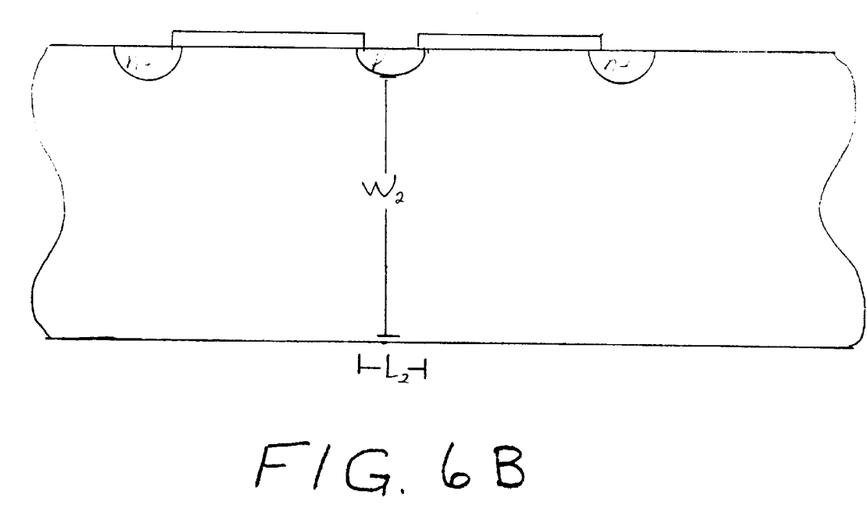

Further, the P-channel type and the N-channel type MOS transistors 116 and 117 are designed to have gate lengths greater than those of the P-channel type and the N-channel type MOS transistors 115 and 118. A driving performance of the inverter 101 is thereby sufficiently smaller than that of a driving circuit 200 for driving the input terminal 113. In addition, it becomes possible that gate capacities of the P-channel type and the N-channel type MOS transistors 115 and 116 are kept at a small level. As a result, load to the inverter 103 is small enough to make an output terminal 112 rapidly operable. As to a difference between these gate lengths, as shown in FIGS. 6A and 6B, preferably, the gate lengths $L_1$ is 2.0 to 4.0 micrometers with the channel width $W_1$ of approximately 2.0 micrometers in the P-channel type and the N-channel type MOS transistors 116 and 117 while the gate lengths $L_2$ is 0.8 micrometer with the channel width $W_2$ of 4.0 micrometers in all the transistors except for the P-channel type and the N-channel type MOS transistors 116 and 117. It is thereby achieved that the P-channel type and the N-channel type MOS transistors 116 and 117 have a driving performance not more than one-fifth of that of the transistors of the circuit 200. Consequently, it is not necessary that transfer gates are provided in the above-mentioned loop.

Referring to FIG. 4 with reference to FIG. 3 continued, description is made about an operation of the latching circuit illustrated in FIG. 3.

At first, during a term t1, since a clock signal CLK is kept at low level, as shown in FIG. 4, the transfer gate 114 is rendered OFF. The input signal D supplied to the data input terminal 111 does not influence the loop constructed from the inverters 101 and 103. In FIG. 4, an inverse output signal Q supplied to the output terminal 112 is kept at high level during the term t1. The input terminal 113 is rendered low level by the inverter 101. In other words, the N-channel type MOS transistor 115 is rendered OFF while the N-channel type MOS transistors 116, 117 and 118 are rendered ON.

Second, during a term t2, the clock signal CLK is changed into high level, the transfer gate 114 is rendered ON. As a result, the data input terminal 111 and the input terminal 113 are electrically connected to each other. Under the situation, the input signal D is changed into high level. Consequently, a high level signal from the data input terminal 111 and a low level signal from the inverter 101 are supplied to the input terminal 113. However, the N-channel type MOS transistor 117 has a gate length greater than those of the other transistors and a driving performance sufficiently smaller than those of the transistors of the forward circuit 200. A potential of the input terminal 113 is rapidly changed into high level. When the potential of the input terminal 113 becomes high level, the inverse output signal Q is rapidly turned into low level.

Thereafter, at the end of the term t2, the clock signal CLK becomes low level. Then, the transfer gate 114 is again rendered OFF. As a result, the level of the inverse output signal Q is kept by the loop constructed from the inverters 101 and 103.

Third, at a term t4, namely, when the inverse output signal Q is turned from low level into high level, the latching circuit illustrated in FIG. 3 is subjected to similar operations. In this case, a low level signal from the data input terminal 111 and a high level signal from the inverter 101 are supplied to the input terminal 113. However, the N-channel type MOS transistor 116 has a gate length greater than those of the other transistors and a driving performance sufficiently smaller than those of the transistors of the forward circuit 200. A potential of the input terminal 113 is rapidly changed into low level. When the potential of the input terminal 113 becomes low level, the inverse output signal Q is rapidly turned into high level.

Thus, according to the latching circuit illustrated in FIG. 3, the inverter 101 has a small driving performance for supplying a feedback output to the input terminal 113. It is not necessary that a transfer gate is formed in the loop. Further, gate capacitance of the transistors of the inverter 101 is small. As a result, the inverter 103 is subjected to a small load. Accordingly, consumptive power supply is economized, and a renewal of the latched data is rapidly carried out.

Figure 5:
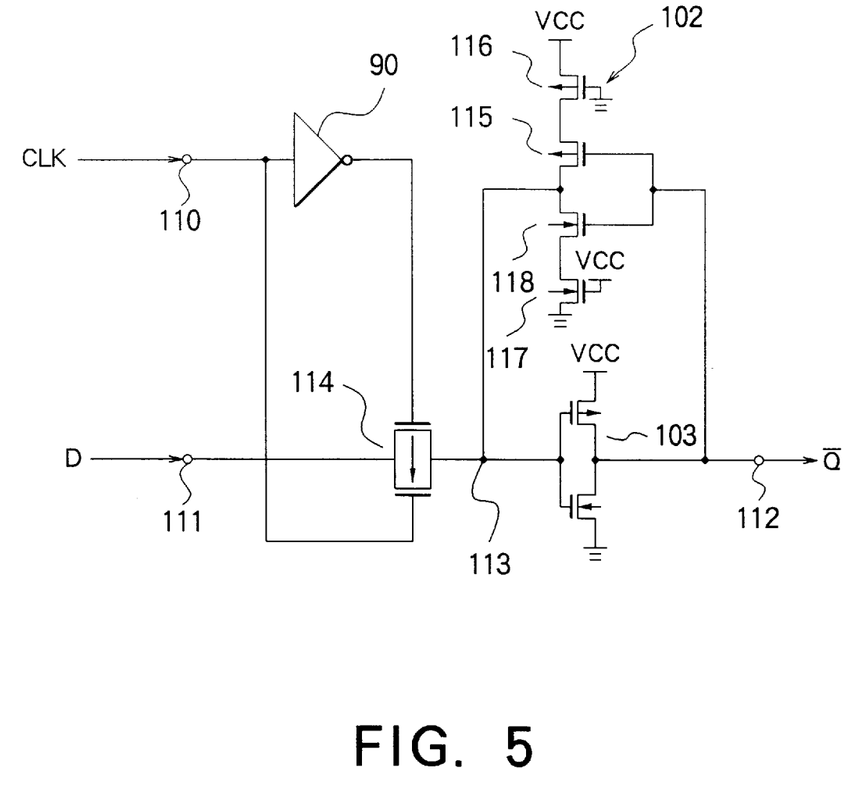
FIG. 5 is a view for describing another latching circuit according to a second embodiment of the present invention.

Referring to FIG. 5, description is made about a latching circuit according to a second embodiment of the presence invention.

The latching circuit according to the second embodiment has a structure similar to that of the first embodiment illustrated in FIG. 3 except that the inverter 101 of FIG. 3 is represented by the inverter 102. Similar portions are designated by like reference numerals. In the inverter 102 illustrated in FIG. 5, an order of row of the transistors 115 to 118 of the inverter 101 is rearranged, although the inverter 102 is operable similarly to the inverter 101.

While this invention has thus far been described in specific conjunction with a few preferred embodiments thereof, it will now be readily possible for one skilled in the art to carry this invention into effect in various other manners. For example, in the above first and second embodiments, as to a relation of the sizes between the N-channel type MOS transistors 116 and 117 and the other transistors, only the N-channel type MOS transistors 116 and 117 are designed to have large gate lengths while all the other transistors are designed to have equal gate lengths to each other. Alternatively, the N-channel type MOS transistors 116 and 117 may be designed to have gate lengths larger than those of the transistors of the circuit 200 while the N-channel type MOS transistors 115 and 118 may be designed to have gate lengths smaller than those of the transistors of the circuit 200. In order to obtain a meritorious effect of the present invention, it is required that the N-channel type MOS transistors 116 and 117 have gate lengths larger than those of the N-channel type MOS transistors 115 and 118. Moreover, in the above first embodiment, the gate lengths L is 2.0 to 4.0 micrometers with the channel width W of approximately 2.0 micrometers in the P-channel type and the N-channel type MOS transistors 116 and 117 while the gate lengths L is 0.8 micrometer with the channel width W of 4.0 micrometers in all the transistors except for the P-channel type and the N-channel type MOS transistors 116 and 117. However, such a difference between these gate lengths is not restricted to the above.

What is claimed is:
1. A latching circuit comprising:
a first inverter having a first input side and a first output side, said first input side being electrically connected to an input terminal;
a second inverter having a second input side and a second output side, said second input side being electrically connected to said first output side, said second output side being electrically connected to said input terminal, said second inverter further having;
first and second transistors having a primary conduction-type and being serially connected between a first power supply terminal and said input terminal, said first and second transistors including first and second grates, respectively, said first and said second gates having first and second gate lengths, respectively;
third and fourth transistors having a secondary conduction-type opposite of said primary conduction-type and being serially connected between a second power supply terminal and said input terminal, said third and said fourth transistors including third and fourth gates, respectively, said third and said fourth gates having third and fourth gate lengths, respectively;
said first gate length being greater than said second gate length; and
said third gate length being greater than said fourth gate length,
wherein said first inverter further comprises fifth and sixth transistors serially connected between said first and said second power supply terminals and including fifth and sixth gates, respectively, said fifth and said sixth gates having fifth and sixth gate lengths, respectively, said second, said fourth, said fifth and said sixth gate lengths being equal.
2. A latching circuit comprising:
a first inverter having a first input side and a first output side, said first input side being electrically connected to an input terminal;
a second inverter having a second input side and a second output side, said second input side being electrically connected to said first output side, said second output side being electrically connected to said input terminal, said second inverter further having:

first and second transistors having a primary conduction-type and being serially connected between a first power supply terminal and said input terminal, said first and second transistors including first and second gates, respectively, said first and said second gates having first and second gate lengths, respectively;

third and fourth transistors having a secondary conduction-type opposite of said primary conduction-type and being serially connected between a second power supply terminal and said input terminal, said third and said fourth transistors including third and fourth gates, respectively, said third and said fourth gates having third and fourth gate lengths, respectively;

said first gate length being greater than said second gate length; and said first gate length being greater than said fourth gate length, said latching circuit further comprising a driving circuit electrically connected to said input terminal through a transfer gate and having a first driving performance, said second inverter having a second driving performance, wherein said first driving performance is larger than said second driving performance.

3. A latching circuit comprising:

a first inverter having a first input side and a first output side, said first input side being electrically connected to an input terminal;

a second inverter having a second input side and a second output side, said second input side being electrically connected to said first output side, said second output side being electrically connected to said input terminal, said second inverter further having:

first and second transistors having a primary conduction-type and being serially connected between a first power supply terminal and said input terminal, said first and second transistors including first and second gates, respectively, said first and said second gates having first and second gate lengths, respectively;

third and fourth transistors having a secondary conduction-type opposite of said primary conduction-type and being serially connected between a second power supply terminal and said input terminal, said third and said fourth transistors including third and fourth gates, respectively, said third and said fourth gates having third and fourth gate lengths, respectively;

said first gate length being greater than said second gate length; and said third gate length being greater than said fourth gate length, wherein said first gate of said first transistor is electrically connected to said second power supply terminal, said third gate of said third transistor being electrically connected to said first power supply terminal, said gates of said second and said fourth transistors being electrically connected to said output side of said first inverter, wherein said first inverter further comprises fifth and sixth transistors serially connected between said first and said second power supply terminals and including fifth and sixth gates, respectively, said fifth and said sixth gates having fifth and sixth gate lengths, respectively, said second, said fourth, said fifth and said sixth gate lengths being equal to each other.

4. A latching circuit comprising:

a first inverter having a first input side and a first output side, said first input side being electrically connected to an input terminal;

a second inverter having a second input side and a second output side, said second input side being electrically connected to said first output side, said second output side being electrically connected to said input terminal, said second inverter further having:

first and second transistors having a primary conduction-type and being serially connected between a first power supply terminal and said input terminal, said first and second transistors including first and second gates, respectively, said first and said second gates having first and second gate lengths, respectively;

third and fourth transistors having a secondary conduction-type opposite of said primary conduction-type and being serially connected between a second power supply terminal and said input terminal, said third and said fourth transistors including third and fourth gates, respectively, said third and said fourth gates having third and fourth gate lengths, respectively;

said first gate length being greater than said second gate length; and said first gate length being greater than said fourth gate length, wherein said first gate of said first transistor is electrically connected to said second power supply terminal, said third gate of said third transistor being electrically connected to said first power supply terminal, said gates of said second and said fourth transistors being electrically connected to said output side of said first inverter, said latching circuit further comprising a driving circuit electrically connected to said input terminal through a transfer gate and having a first driving performance, said second inverter having a second driving performance, wherein said first driving performance is larger than said second driving performance.

* * * * *